United States Patent
Kikuchi et al.

(10) Patent No.: US 7,154,048 B2
(45) Date of Patent: Dec. 26, 2006

(54) COMMON ELECTRODE WIRE FOR PLATING

(75) Inventors: Masayoshi Kikuchi, Tokyo (JP); Masahiro Ohtahara, Tokorozawa (JP); Kiyoshi Shimizu, Tokyo (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 774 days.

(21) Appl. No.: 09/979,071

(22) PCT Filed: Apr. 4, 2001

(86) PCT No.: PCT/JP01/02911

§ 371 (c)(1),
(2), (4) Date: Nov. 16, 2001

(87) PCT Pub. No.: WO01/78139

PCT Pub. Date: Oct. 18, 2001

(65) Prior Publication Data

US 2002/0157958 A1    Oct. 31, 2002

(30) Foreign Application Priority Data

Apr. 12, 2000    (JP) ............................. 2000-110109

(51) Int. Cl.
*H01R 12/04*    (2006.01)
*H05K 1/11*    (2006.01)

(52) U.S. Cl. .................. 174/261; 438/460; 29/849

(58) Field of Classification Search ............ 438/460, 438/462, 110–114; 29/849; 174/255, 260, 174/261

See application file for complete search history.

(56) References Cited

U.S. PATENT DOCUMENTS

| | | | | |
|---|---|---|---|---|
| 4,426,773 | A | * | 1/1984 | Hargis .................... 29/832 |
| 6,214,645 | B1 | * | 4/2001 | Kim ........................ 438/110 |
| 6,300,577 | B1 | * | 10/2001 | Tsujii ..................... 174/261 |
| 6,319,750 | B1 | * | 11/2001 | Huang et al. ........... 438/106 |
| 6,399,417 | B1 | * | 6/2002 | Lee et al. ................. 438/106 |
| 6,630,368 | B1 | * | 10/2003 | Hasegawa ............... 438/113 |
| 6,828,175 | B1 | * | 12/2004 | Wood et al. ............. 438/113 |
| 2001/0045663 | A1 | * | 11/2001 | Edura et al. ............ 257/773 |

FOREIGN PATENT DOCUMENTS

| | | | |
|---|---|---|---|
| JP | 07/66932 | | 7/1995 |
| JP | 8-148770 | | 6/1996 |
| JP | 8-153819 | * | 6/1996 |
| JP | 9-55398 | | 2/1997 |
| JP | 11-340609 | | 12/1999 |

* cited by examiner

*Primary Examiner*—Kamand Cuneo
*Assistant Examiner*—Jeremy Norris
(74) *Attorney, Agent, or Firm*—Manabu Kanesaka (57) ABSTRACT

A common electrode line for plating is used for forming conductive patterns of a plurality of circuit substrates on a main substrate. The main substrate has a cut line for dividing one and the other circuit substrates and a plurality of through holes formed on the one and the other circuit substrates along the cut line. The common electrode lines for plating includes first common electrode lines formed on one side of the main substrate, and second common electrode lines formed on the other side of the main substrate. Each first common electrode line extends from one through hole formed on the one circuit substrate to one through hole formed on the other circuit substrate. Each second common electrode line extends from the one through hole formed on the one circuit substrate to another through hole formed on the other circuit substrate.

8 Claims, 11 Drawing Sheets

Prior Art

COMMON ELECTRODE WIRE FOR PLATING

TECHNICAL FIELD

The present invention relates to common electrode lines for plating for collectively forming a conductive pattern of a plurality of circuit substrates on a main substrate, e.g., common electrode lines for plating for collectively forming electrode pads and a conductive pattern of a ball grid array (BGA) type semiconductor package circuit substrate.

BACKGROUND ART

In recent years, with becoming smaller and denser of semiconductor packages, a ball grid array (BGA) type semiconductor package that is flip chip bonded and wire bonded in which a bare chip is directly mounted facedown on a substrate has been developed.

Further, with emergence of a camera-integrated VTR, a cellular telephone and the like, a portable equipment having a small package which has substantially the same size as that of the bare chip, so-called CSP. (chip size/scale package) has appeared. The development of the CSP has been rapidly pursued and the demands of the market have been increased.

Technique of a conventional wiring substrate using a flexible film for TAB is disclosed in Japanese Patent Application Publication No. 7-66932. According to this technique, as shown in FIG. 1 of this publication, in an electrical connection and short circuit frame in an etching wiring 4 for an integrated circuit, a lead wire 1 extending to a connecting point 2 with respect to a wire of adjacent integrated circuits is formed in a meandering manner. Therefore, by cutting between adjacent integrated circuits at a cutting position 7, the integrated circuits can be divided without wasting material. As a result, all the short circuit connections of the meandering pattern are separated by cutting at the cutting position 7, and the meandering pattern is formed as a terminal (lead wire) in the integrated circuit.

Figure 10:
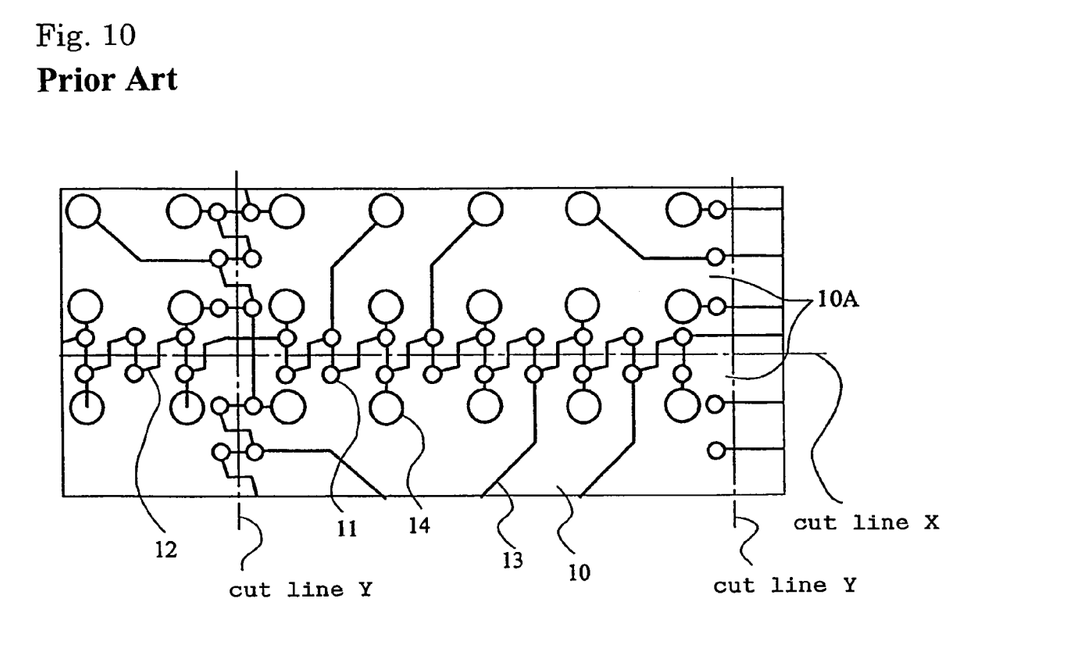
FIG. 10 is a partial plan view of a circuit substrate showing a pattern example of a conventional common electrode line for plating.

FIG. 10 is a partial plan view of adjacent chip circuits showing one pattern of another conventional common electrode line for plating described in Japanese Patent Application Laid-open No. 9-55398.

In FIG. 10, in a semiconductor substrates 10, a plurality of chip circuits are collectively formed on a same semiconductor substrate 10. The semiconductor substrate 10 comprises a silicon substrate, and is cut into a predetermined size to divide into a large number of chip circuits.

Common electrode lines for plating 12 are connected to electrode pads 14 of said each adjacent chip circuit 10A. The common electrode lines for plating 12 are meandering in a crank shape across cut lines X and Y.

Wiring (conductive) patterns 13 of each chip circuit 10A are formed of the common electrode lines for plating 12.

The electrode pads 14 are disposed on an active surface side of the semiconductor substrate 10. Each electrode pad 14 is connected to the corresponding wiring pattern 13 and functions as an external connecting electrode.

Each common electrode line for plating 12 has a predetermined width, and meanders in the crank shape across the cut line X. Since the common electrode lines for plating 12 are formed on the same surface of the main substrate 10, a constant gap G1 is provided between the wiring patterns 13 so that the adjacent common electrode lines for plating 12 do not come into contact with each other.

Figure 11:
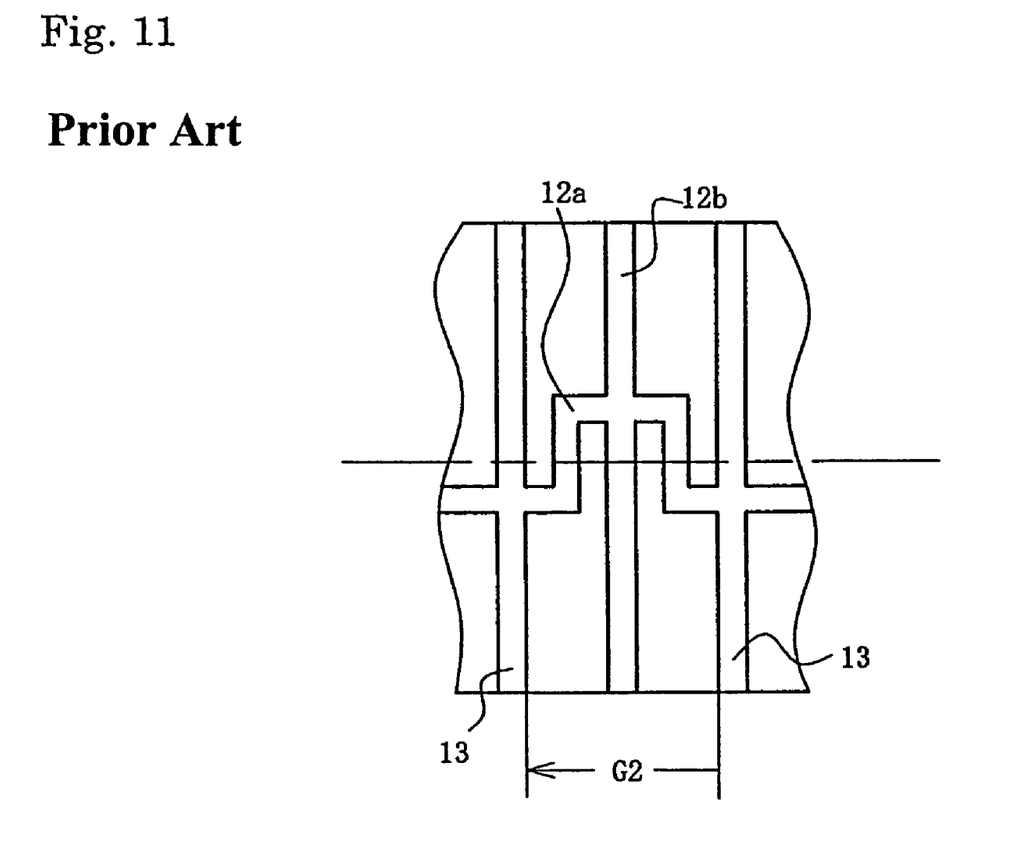
FIG. 11 is an enlarged view of an essential portion in a pattern example of another conventional plating electrode line.

FIG. 11 is an enlarged plan view of an essential portion showing a pattern of another conventional common electrode line for plating. The common electrode lines for plating 12 comprise a main line 12a sequentially formed between wiring patterns (conductive patterns), and branch lines 12b branched from the main line 12a for connecting particular pads (only a portion is shown in FIG. 11). In this case also, a constant gap G2 is provided between the wiring patterns 13 so that adjacent common electrode lines for plating 12 (12a, 12b) do not come into contact with each other.

In these conventional techniques, the common electrode lines for plating 12 for short-circuiting pad patterns are provided before the electrolytic plating processing and then, electrode material is deposited on each pad pattern by the electrolytic plating processing to form a plurality of pad electrodes collectively. At the time of the electrolytic plating processing, all the pad patterns have the same electric potential by the common electrode lines for plating 12, and a deposition amount and a film thickness of the electrode material of each pad pattern are prevented from being varied. By forming the common electrode lines for plating 12 across the cut lines X and Y in a meandering manner, even if slight positional deviation of dicing is generated in a dicing step, it is possible to reliably (shut off conductively) cut the common electrode lines for plating 12, and short caused by short circuit of the common electrode lines for plating in each chip circuit 10A is eliminated. Further, since the cutting width in the dicing step is narrow, the chip circuit 10A can be cut and divided without waste of the substrate material.

However, the above-described conventional common electrode lines for plating have the following problems.

That is, the common electrode lines for plating 12 are formed such as to meander in the crank shape across the cut line. Each common electrode line for plating 12 has a predetermined width and is formed on the same surface of the main substrate. Therefore, it is necessary to provide predetermined gaps G1 and G2 between the wiring patterns 13 and 13 so that the adjacent common electrode lines for plating, or the common electrode line for plating and the wiring pattern (conductive pattern) do not come into contact with each other. Thus, the number of terminals (the number of pins) formed per one side of the circuit substrate is limited, and it is difficult to form the terminals at high density.

Even if the shape of the common electrode lines for plating is changed from the crank shape into an inclined shape, it is difficult to increase the number of terminals by the same reason.

Thereupon, it is an object of the present invention to provide high reliable common electrode lines for plating of a main substrate in which the waste of substrate material at the time of dicing is eliminated, the gap between the wiring patterns is narrowed as small as possible, the number of terminals per one side of each circuit substrate is increased, and the terminals can be formed at high density.

DISCLOSURE OF THE INVENTION

To achieve the above object, the present invention provides common electrode lines for plating for collectively forming conductive patterns of a plurality of circuit substrates on a main substrate, and for plating the conductive patterns of the plurality of circuit substrates at the same time by the common electrode lines for plating, wherein the common electrode lines for plating respectively connected to pads of the plurality of circuit substrates are formed on both front and back surfaces of the main substrate and connected via through holes each other, and on any of the front and back surfaces of the main substrate, the common electrode lines for plating are wired from the adjacent circuit substrates across a cut line which divides a substrate into the plurality of circuit substrates.

At that time, it is preferable that the common electrode line for plating is formed such as to meander along the cut line.

More specifically, the common electrode line for plating for alternately and continuously connecting through holes in adjacent two circuit substrates is formed on the front surface of the substrate as a main line, and the other common electrode lines for plating which are branched from the main line and connected to a particular pads are formed on the back surface of the substrate as branch lines.

Preferably, the common electrode line for plating for alternately and continuously connecting through holes in adjacent two circuit substrates is formed on the back surface of the substrate as a main line, and the other common electrode lines for plating which are branched from the main line and connected to particular pads are formed on the front surface of the substrate as branch lines, and vice versa.

According to the common electrode line for plating of the present invention having the above construction, each adjacent circuit substrate is divided without wasting the substrate material. Further, even if a distance between the conductive patterns is narrowed, each circuit substrate is reliably divided without generating short circuit by the common electrode lines for plating formed on the front and back surfaces of the main substrate. As a result, the number of terminals of the circuit substrate is remarkably increased, and it is possible to provide a highly density circuit substrate required in the market.

BEST MODE FOR CARRYING OUT THE INVENTION

The present invention will be explained in detail based on the accompanying drawings.

Figure 1:
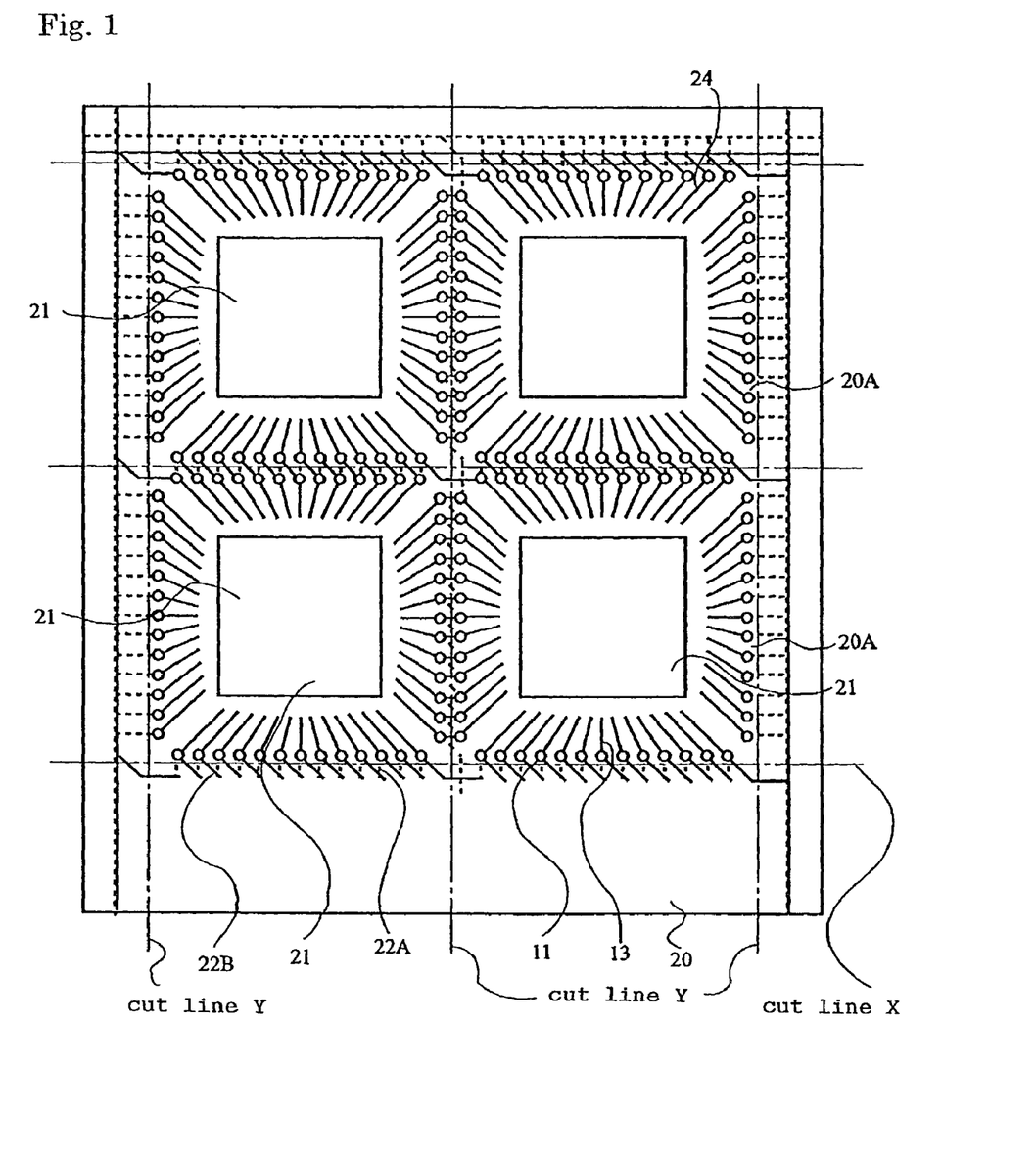
FIG. 1 shows one pattern example of a common electrode line for plating of the present invention formed on a main substrate on the side at which an IC is mounted.
Figure 2:
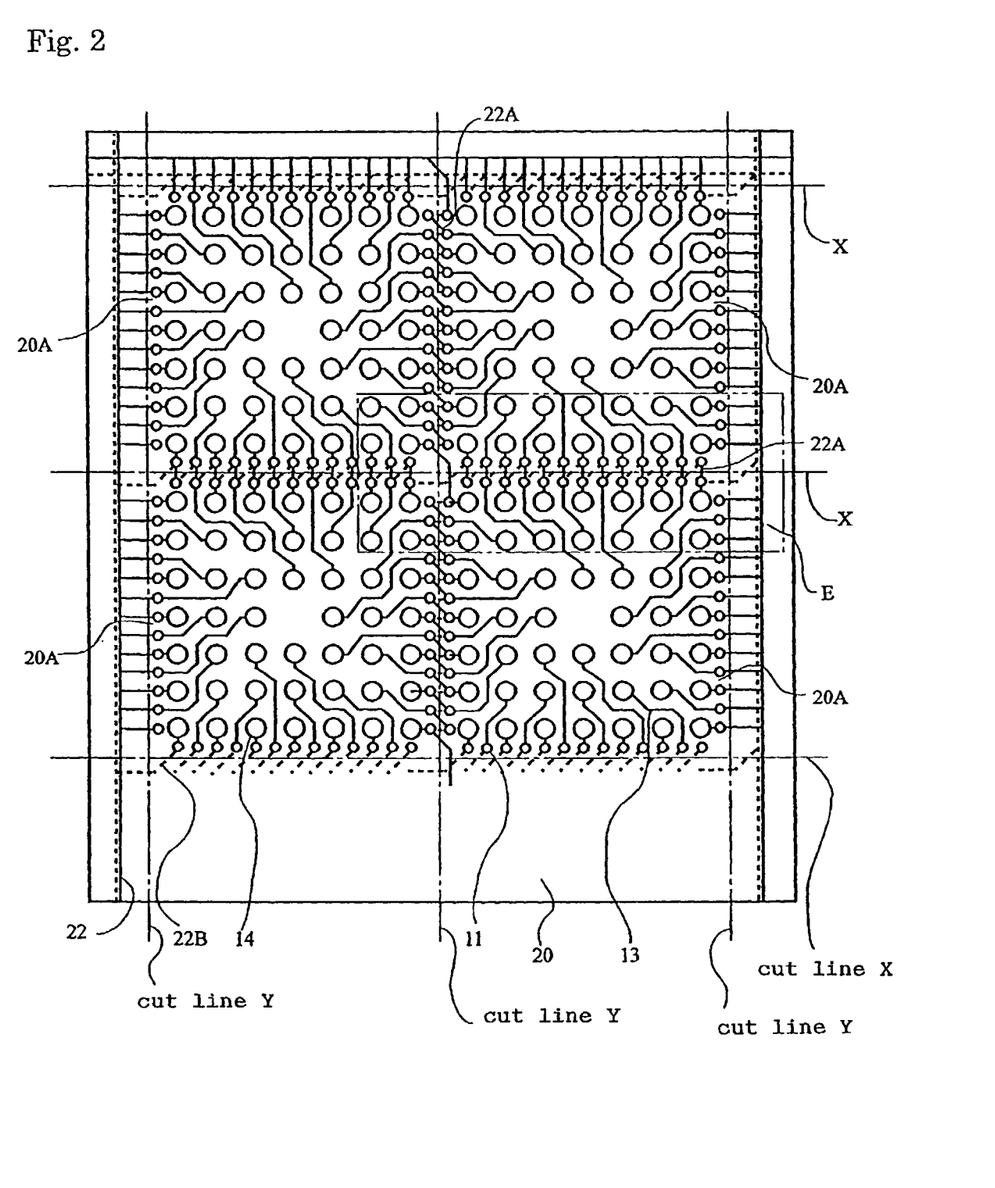
FIG. 2 shows one pattern example of a common electrode line for plating appearing on the main substrate shown in FIG. 1 on the side at which soldering bumps are formed.

In FIGS. 1 and 2, a main substrate 20 is cut and divided into a plurality of (four, in the drawings) circuit substrates 20A. On a front surface of each circuit substrate 20A, IC connecting bonding patterns 24 are radially disposed in correspondence with pad electrodes (not shown) of an IC chip 21. The bonding pattern 24 is wire bonded to the pad electrode of the IC chip 21.

A plurality of through holes 11 are formed along cut lines X and Y on a peripheral edge of each circuit substrate 20A. Common electrode lines for plating 22 comprise electrode lines 22A formed on the main substrate 20 on the side (front surface) at which soldering bumps that are external connecting conductive pattern of the main substrate 20 are formed, and electrode lines 22B formed on the main substrate 20 on the side (back surface) at which electronic component is mounted. The common electrode lines for plating 22A and 22B are connected to each other via the through hole 11, and meander as a whole across the cut lines X and Y for dividing the circuit into the respective circuit substrates 20A.

In FIGS. 1 and 2, the common electrode line for plating 22A intersects the cut line X at right angles, the common electrode line for plating 22B is inclined with respect to the cut line X, the common electrode line for plating 22A is inclined with respect to the cut line Y, and the common electrode line for plating 22B intersects the cut line Y at right angles. The common electrode lines for plating 22A and 22B are connected to the IC connecting bonding pattern in FIG. 1, and are connected to a conductive patterns 13 which are connected to the soldering ball pads 14. That is, the common electrode lines for plating 22A and 22B formed adjacently are formed on front and back surfaces of the circuit substrate 20A across the cut lines. By continuously connecting the common electrode lines for plating 22A and 22B through the through hole 11, the entire common electrode lines for plating form a common electrode line for plating meandering across the cut lines X and Y.

Figure 3:
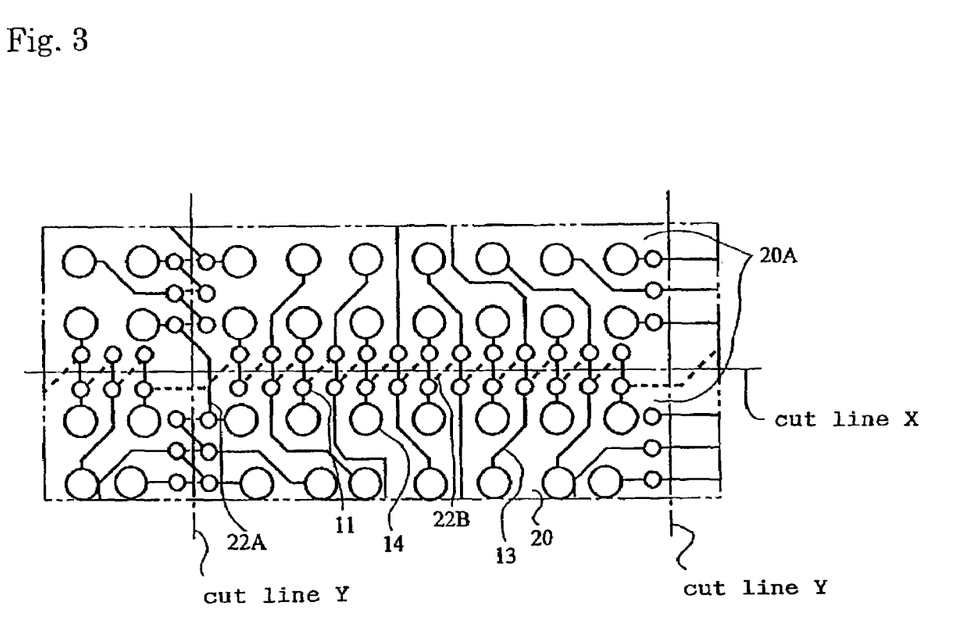
FIG. 3 is an enlarged view of a portion E surrounded by dot-dash lines in FIG. 2.
Figure 4:
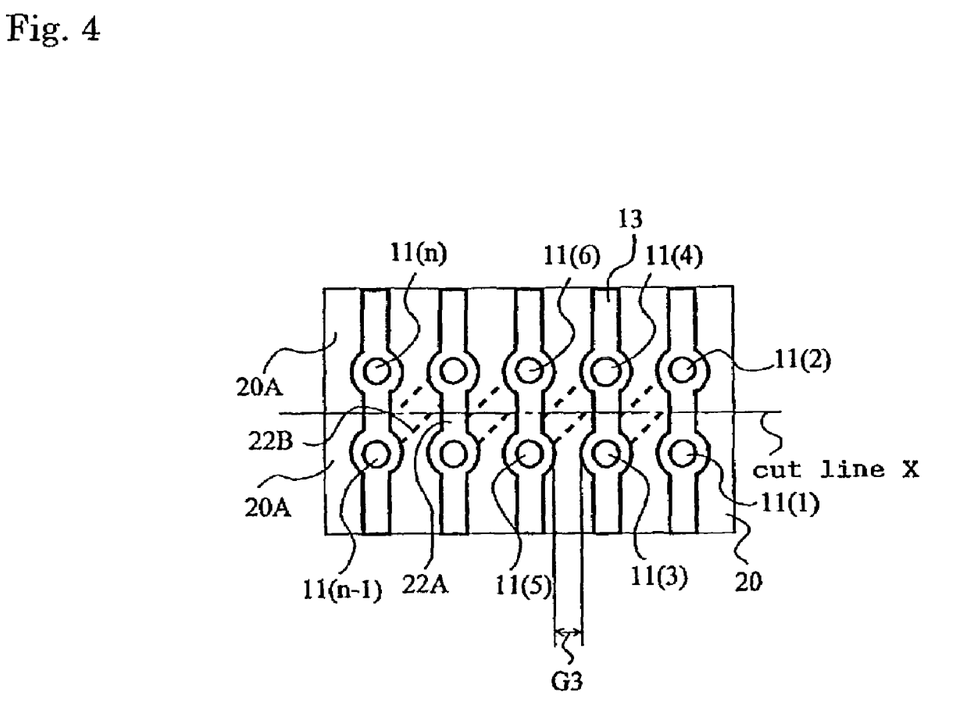
FIG. 4 is an enlarged view of an essential portion in FIG. 3.

FIG. 3 shows a portion E surrounded by dot-dash lines in FIG. 2. FIG. 4 is an enlarged view of an essential portion of FIG. 3.

The through holes 11 are formed on peripheral edges of each circuit substrates 20A constituting the main substrate 20 at predetermined pitch and predetermined size along the cut lines X and Y. The common electrode lines for plating 22A and 22B are formed in a meandering manner across the cut lines X and Y on front and back surfaces of the main substrate 20, and have predetermined widths. Therefore, a gap G3 is provided between conductive patterns 13 so that the adjacent conductive patterns 13 do not come into contact with each other. However, since the common electrode lines for plating 22A and 22B are separately formed on the front and back surfaces of the main substrate 20, the conductive pattern 13 and the common electrode line for plating 22B do not come into contact with each other, and the gap G3 can be narrowed as close as possible. With this design, the number of terminals per one side of the circuit substrate 20A can be increased. For example, in the case of the one example shown in FIG. 3, 13 terminals can be formed per one side of the circuit substrate 20A, but in the case of the above-described conventional example (FIG. 10), only nine terminals can be formed. According to the present invention, the number of the terminals per one side is greater than the conventional example by four and thus, the number of terminals in four sides of the circuit substrate 20A is four times greater than the conventional example, i.e., greater than the conventional example by 16, and the higher density can be realized.

Here, as shown in FIG. 4, through holes on one circuit substrate are allocated with odd-numbered, and through holes on the other circuit substrate are even-numbered, the common electrode line for plating 22A for connecting from the odd-numbered through hole 11(1) to even-numbered through hole 11(2) is formed on the front surface of the main substrate 20, and the common electrode line for plating 22B for connecting from the even-numbered through hole 11(2) to the odd-numbered through hole 11(3) is formed on the back surface of the main substrate 20.

Figure 5:
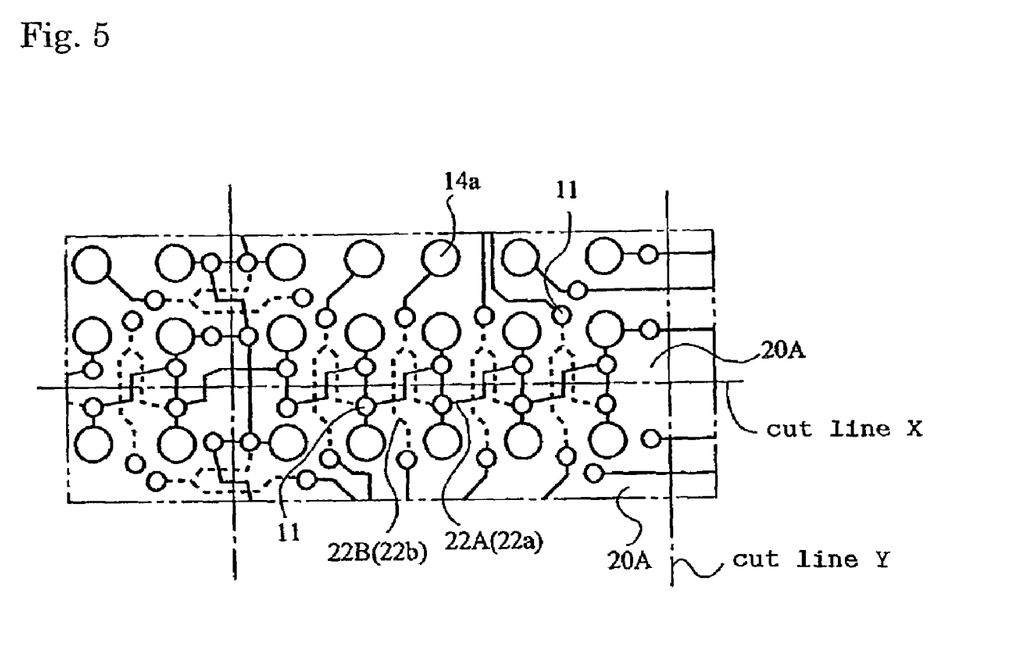
FIG. 5 is an enlarged view showing; in the same manner as FIG. 3, another pattern example of the common electrode line for plating of the invention.

FIG. 5 is an enlarged view of another pattern example of the common electrode line for plating of the present invention.

The common electrode lines for plating shown in FIG. 5 comprise a common electrode line for plating 22A functioning as a main line 22a and common electrode lines for plating 22B functioning as branch lines 22b. The common electrode line for plating 22A connects a plurality of through holes 11 on the front surface of the main substrate 20. The common electrode lines for plating 22B are branched from the common electrode line for plating 22A via the through holes 11 and connected to inner pads 14a disposed inside the circuit substrate 20A.

Figure 6:
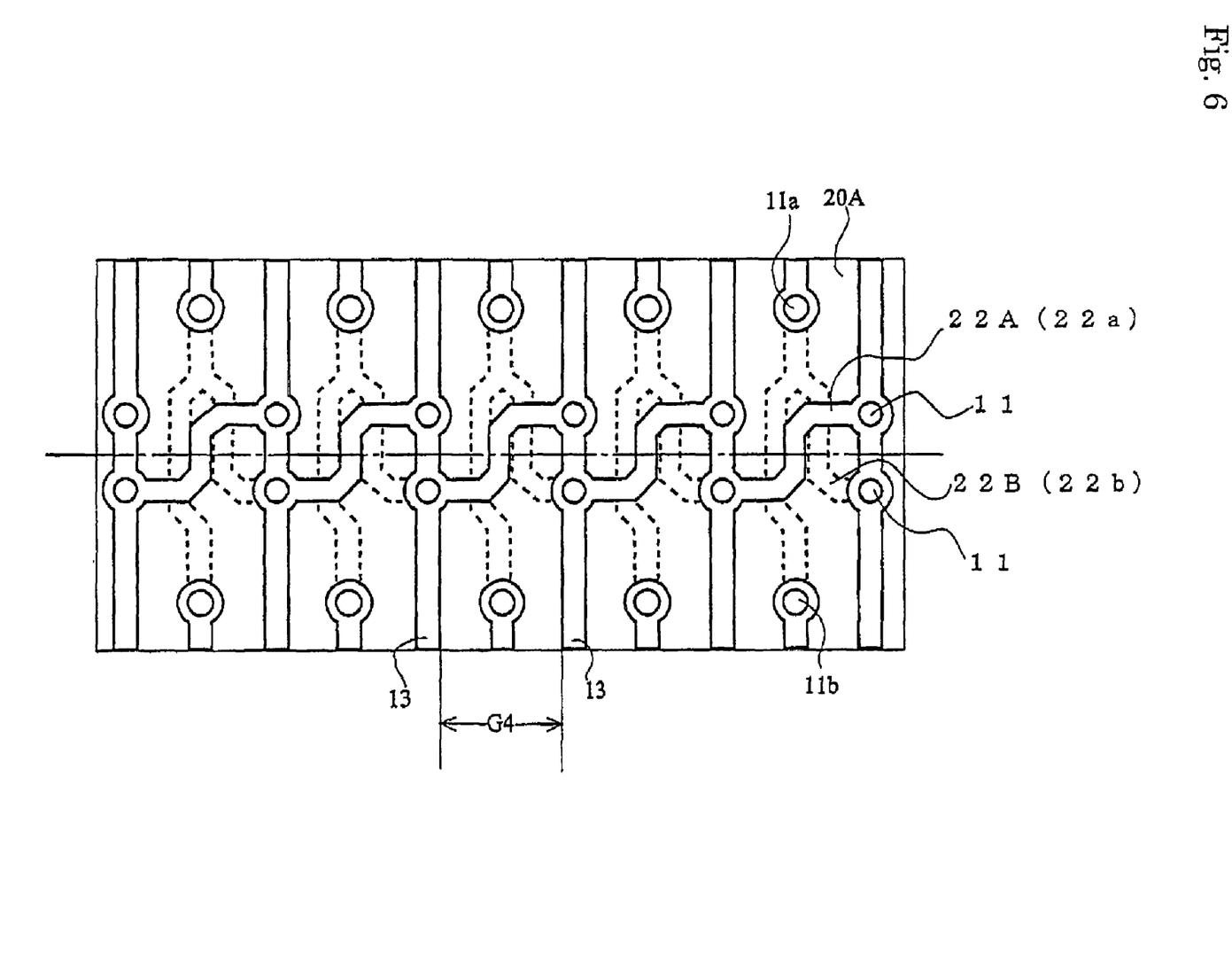
FIG. 6 is an enlarged view of an essential portion in FIG. 5.

FIG. 6 is an enlarged view of an essential portion of FIG. 5. Each the common electrode line for plating 22A functioning as a main line 22a meanders in the crank shape across the cut line X, and alternately connects through holes 11 provided in adjacent circuit substrates 20A.

Each common electrode line for plating 22B functioning as the branch line 22b is connected to an inner pad through hole 11a of the adjacent circuit substrate 20A across the cut line X, and is again branched therefrom bypassing the adjacent circuit substrate 20A, and is connected to an inner pad through hole 11b of its own circuit substrate across the cut line X.

Since the common electrode lines for plating are wired in such a pattern, it is possible to remarkably narrow the gap G4 between the conductive patterns 13 as compared with the gap G2 of conventional technique while keeping the same function as that of the conventional technique shown in FIG. 11.

Although the main line 22a is formed on the front surface of the main substrate 20 and the branch lines 22b are formed on the back surface of the main substrate 20 in the common electrode lines for plating shown in FIGS. 5 and 6, the main line 22a may be formed on the back surface of the main substrate 20 and the branch lines 22b may be formed on the front surface of the main substrate 20.

Figure 7:
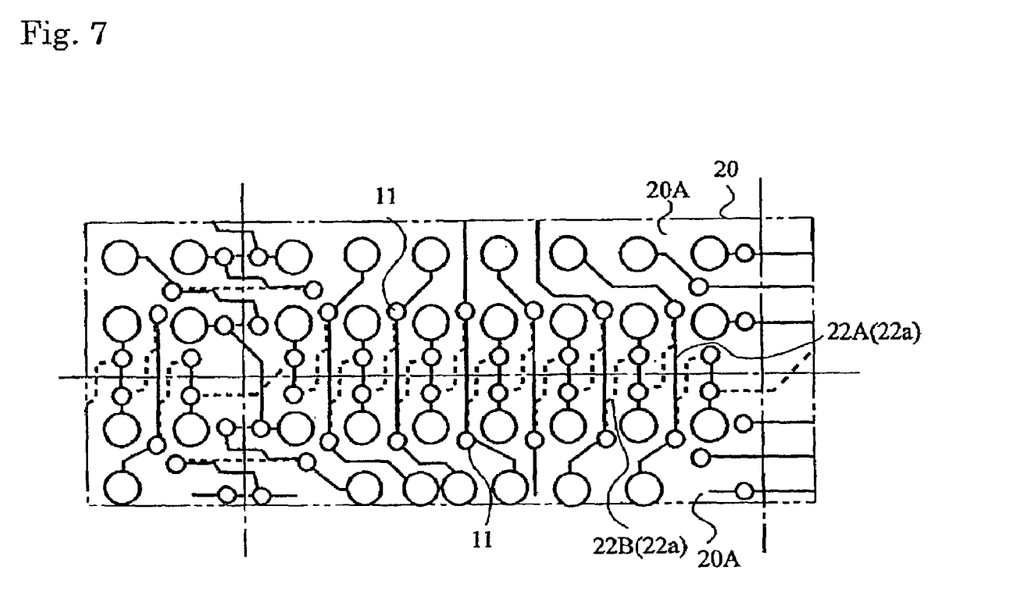
FIG. 7 is an enlarged view showing; in the same manner as FIG. 3, another pattern example of the common electrode line for plating of the invention.

FIG. 7 is an enlarged view of another pattern example of the common electrode line for plating of the present invention. In the common electrode line for plating in FIG. 7, main lines 22a each continuously connecting a plurality of through holes 11 provided in adjacent circuit substrates 20A and 20A are formed on both front and back surfaces of the main substrate 20 alternately. That is, each common electrode line for plating 22A as a main line 22a is straightly formed across the cut line X on the front surface of the main substrate 20, and each common electrode line for plating 22B as a main line 22a is formed across the cut line X in the crank shape on the back surface of the main substrate 20.

Figure 8:
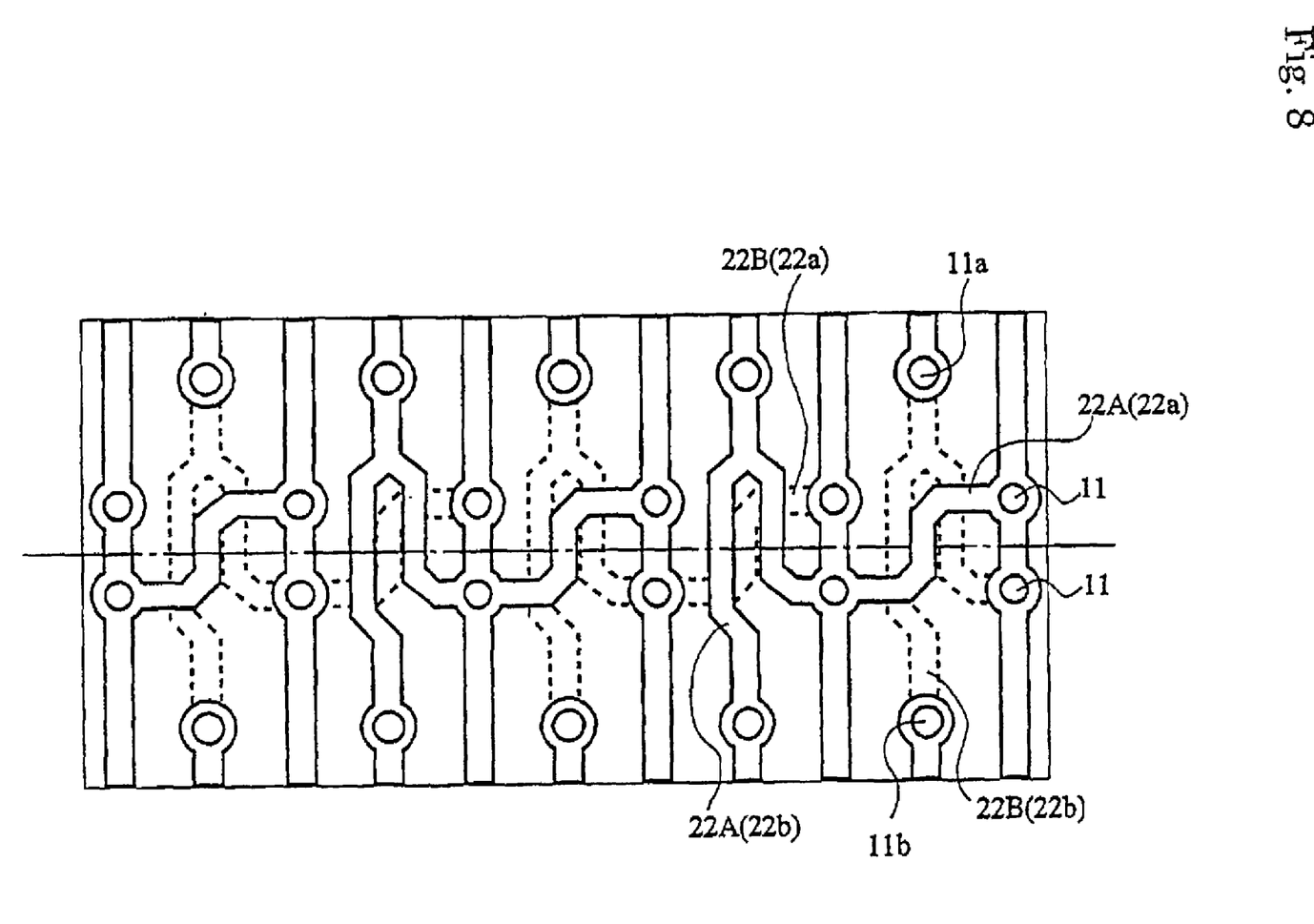
FIG. 8 is an enlarged view of an essential portion showing; in the same manner as FIG. 4, another pattern example of the common electrode line for plating of the invention.

FIG. 8 is an enlarged view of another pattern example of the common electrode line for plating of the present invention. The common electrode line for plating in FIG. 8 is a modification of the pattern example shown in FIG. 6. In this pattern example, the main line 22a meandering in the crank shape across the cut line X is alternately formed on the front and back surfaces of the main substrate 20 through the through holes 11. The branch lines 22b are formed on the surfaces opposite from the main line 22a through the through holes 11.

Figure 9:
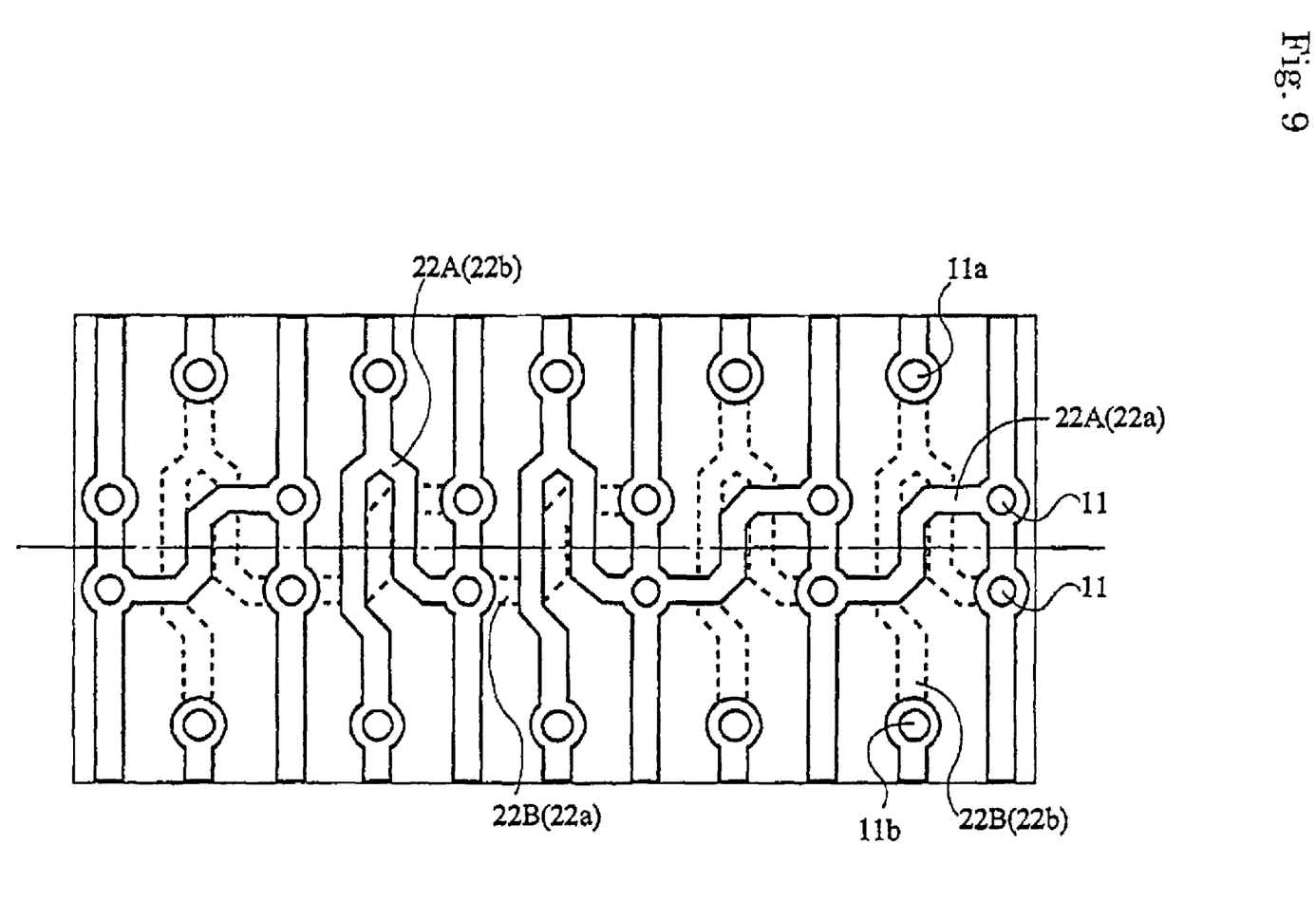
FIG. 9 is an enlarged view of an essential portion showing; in the same manner as FIG. 4, another pattern example of the common electrode line for plating of the invention.

FIG. 9 is an enlarged view of another pattern example of the common electrode line for plating of the present invention. The common electrode line for plating in FIG. 9 is also a modification of the pattern example shown in FIG. 6. In this pattern example, the main line 22a meandering in the crank shape across the cut line X is irregularly formed on the front and back surfaces of the main substrate 20. The branch lines 22b are formed on the surfaces opposite from the main line 22a through the through holes 11 in this case also.

The pattern shape of the common electrode lines for plating and positional relation between the main line and the branch lines are not limited to those described in the above embodiment, and various modifications are possible. Although all the common electrode lines for plating in the above embodiment are formed on the front and back surfaces in a staggered format, the present invention is not limited to this, and the common electrode lines for plating of the invention may be mixed with the common electrode line for plating meandering on only one surface of the circuit substrate as shown in the conventional technique.

As described above, the common electrode lines for plating 22 (22a, 22b) for establishing short circuit in a pad pattern are formed before the electrolytic plating processing, electrode material is deposited on each pad pattern by the electrolytic plating processing to collectively form a plurality of pad electrodes. As a result, at the time of electrode plating processing, all the pad patterns are at the same electric potential by the common electrode line for plating 22, and a deposition amount and a film thickness of the electrode material of each pad pattern are prevented from being varied. By forming the common electrode line for plating 22 across the cut lines X and Y in a meandering manner and carrying out the dicing, even if slight positional deviation of dicing is generated in a dicing step, it is possible to reliably cut the common electrode line for plating 22. As a result, short caused by short circuit of the common electrode line for plating in each chip circuit is eliminated. Further, since the cutting width in the dicing step may be narrow, the chip circuit can be cut and divided without waste of the substrate material.

INDUSTRIAL APPLICABILITY

The present invention can effectively utilized as a circuit substrate having electronic components at high density, and the invention can preferably be used for small portable equipment, e.g., electronic clock and communication equipment.

What is claimed is:

1. A common electrode line for plating for collectively forming conductive patterns of a plurality of circuit substrates on a main substrate, and for plating the conductive patterns of the plurality of circuit substrates at the same time by the common electrode line for plating, said main substrate having a cut line for dividing one and the other circuit substrates and a plurality of through holes formed in said one and the other circuit substrates along the cut line, said common electrode line for plating comprising:

first common electrode lines formed on one side of the main substrate, each of said first common electrode lines extending from one through hole formed in said one circuit substrate to one through hole formed in the other circuit substrate while crossing the cut line, and second common electrode lines formed on the other side of the main substrate, each of said second common electrode lines extending from said one through hole formed in said one circuit substrate to another through hole formed in the other circuit substrate next to said one through hole of the other circuit substrate while crossing the cut line, wherein said first and second common electrode lines formed on said one and the other sides of the main substrate are meandering lines.

2. A common electrode line for plating according to claim 1, wherein said through holes formed in the one circuit substrate are connected to the through holes formed in the other circuit substrate alternately, respectively.

3. A common electrode line for plating according to claim 1, wherein said first and second common electrode lines for plating are branched from said one through hole.

4. A common electrode line for plating for collectively forming conductive patterns of a plurality of circuit substrates on a main substrate, and for plating the conductive patterns of the plurality of circuit substrates at the same time by the common electrode line for plating, said main substrate having a cut line for dividing one and the other circuit substrates and a plurality of through holes formed in said one and the other circuit substrates along the cut line, wherein said through holes comprise close through holes located close to the cut line, and far through holes located away from the cut line, which are formed alternately in the respective circuit substrates, and said common electrode line for plating comprises at least two first common electrode lines formed on one side of the main substrate, one first common electrode line extending from one close through hole formed in said one circuit substrate to one close through hole formed in the other circuit substrate corresponding thereto while crossing the cut line, and the other first common electrode line extending from said one close through hole formed in said one circuit substrate to another close through hole next to said one close through hole formed in said other circuit substrate while crossing the cut line, said at least two first common electrode lines being selected from a group consisting of a straight line perpendicular to the cut line, and a meandering line, and at least two second common electrode lines formed on the other side of the main substrate, one second common electrode line extending from said one far through hole formed in the one circuit substrate to one far through hole formed in the other circuit substrate corresponding thereto while crossing the cut line, and the other second common electrode line extending from said one far through hole formed in the one circuit substrate to one close through hole next to said one far through hole formed in said other circuit substrate while crossing the cut line.

5. A common electrode line for plating according to claim 4, wherein said first and second common electrode lines are connected to the conductive patterns formed on the one and the other sides through the through holes.

6. A common electrode line for plating according to claim 5, wherein said conductive patterns formed on one side of the circuit substrates are electrode patterns for connecting electronic parts, and said conductive patterns formed on the other side are electrode patterns for outer connection.

7. A common electrode line for plating according to claim 4, wherein said at least two first common electrode lines formed on one side and said at least two second common electrode lines formed on the other sides are formed repeatedly in a predetermined order.

8. A common electrode line for plating according to claim 4, wherein said at least two second common electrode lines are meandering lines.

\* \* \* \* \*